(12) United States Patent
Williams et al.

(10) Patent No.: US 10,754,376 B1
(45) Date of Patent: Aug. 25, 2020

(54) INDUSTRIAL AUTOMATION DISPLAY DEVICE

(71) Applicant: Rockwell Automation Technologies, Inc., Mayfield Heights, OH (US)

(72) Inventors: Mark S. Williams, Waukesha, WI (US); Shravan Rajmohan, Bengaluru (IN); Pete J. Klein, Kenosha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/380,500

(22) Filed: Apr. 10, 2019

(51) Int. Cl.
| | | |
|---|---|---|
| *G06F 1/16* | (2006.01) |
| *H05K 5/00* | (2006.01) |
| *G06F 3/041* | (2006.01) |
| *H05K 5/02* | (2006.01) |
| *G02F 1/1333* | (2006.01) |

(52) U.S. Cl.
CPC .......... *G06F 1/1609* (2013.01); *G06F 3/0412* (2013.01); *H05K 5/0017* (2013.01); *H05K 5/0204* (2013.01); *G02F 1/133308* (2013.01)

(58) Field of Classification Search
CPC ... G06F 1/1609; G06F 3/0412; H05K 5/0204; H05K 5/0017; G02F 1/133308
See application file for complete search history.

(56) References Cited

U.S. PATENT DOCUMENTS

| | | | | |
|---|---|---|---|---|
| 6,020,867 A * | 2/2000 | Shimada | ........... | G02F 1/133382 345/87 |
| 7,027,112 B2 * | 4/2006 | Wang | ................ | G02F 1/133308 349/58 |
| 7,597,393 B1 * | 10/2009 | Tuccinardi | .......... | B60R 11/0211 297/188.04 |
| 7,974,082 B2 * | 7/2011 | Uchimi | ................. | G06F 1/1609 361/679.21 |
| 7,978,281 B2 | 7/2011 | Vergith et al. | | |
| 8,848,350 B2 * | 9/2014 | Kim | ...................... | G06F 1/1626 200/512 |
| 8,934,227 B2 * | 1/2015 | Cheon | ..................... | H05K 5/02 361/679.21 |
| 9,383,768 B1 * | 7/2016 | Menon | .................. | G06F 1/1626 |
| 9,977,467 B2 * | 5/2018 | Garelli | .................. | G06F 1/1637 |
| 10,345,510 B2 * | 7/2019 | Hwang | ................ | G02B 6/0093 |
| 10,495,909 B2 * | 12/2019 | Chung | .................. | H04M 1/185 |
| 2005/0285990 A1 * | 12/2005 | Havelka | ............ | G02F 1/133308 349/58 |
| 2008/0158796 A1 * | 7/2008 | Hine | ........................ | H04N 5/64 361/725 |
| 2011/0025942 A1 * | 2/2011 | Lee | ................... | G02F 1/133615 349/58 |

(Continued)

*Primary Examiner* — Abhishek M Rathod (74) *Attorney, Agent, or Firm* — Fletcher Yoder, P.C.

(57) ABSTRACT

A user interface display device for displaying information associated with an industrial automation system may have a display that has a front face and one or more outer edges, a cover lens optically bonded to the front face of the display with an optical-grade adhesive, and a bezel that has a frame. The frame is disposed about the display, and the bezel defines a gap between the frame and the one or more outer edges of the display. The display device may also have a quantity of gap-filling adhesive disposed at one or more locations within the gap between the one or more outer edges of the display and the frame of the bezel. The quantity of gap-filling adhesive may couple the display to the bezel.

13 Claims, 4 Drawing Sheets

(56) References Cited

U.S. PATENT DOCUMENTS

| | | | | |
|---|---|---|---|---|
| 2011/0249212 A1* | 10/2011 | Monden | ............ | G02F 1/133308 |
| | | | | 349/58 |
| 2012/0050988 A1* | 3/2012 | Rothkopf | ............ | H04M 1/0266 |
| | | | | 361/688 |
| 2012/0081865 A1* | 4/2012 | Chang | ................. | H04M 1/0266 |
| | | | | 361/759 |
| 2012/0281383 A1* | 11/2012 | Hwang | ................. | G02B 30/25 |
| | | | | 361/807 |
| 2013/0087665 A1* | 4/2013 | Lostoski | ............. | H05K 5/0017 |
| | | | | 248/65 |
| 2015/0212362 A1* | 7/2015 | Takaira | ............... | G02F 1/13338 |
| | | | | 349/12 |
| 2016/0109648 A1* | 4/2016 | Lee | ................... | G02F 1/133308 |
| | | | | 362/606 |
| 2018/0199457 A1* | 7/2018 | Cheng | ...................... | H05K 5/03 |
| 2019/0004566 A1* | 1/2019 | Lee | .......................... | H04R 9/06 |
| 2019/0296259 A1* | 9/2019 | Baek | ..................... | G06F 1/1652 |

\* cited by examiner

INDUSTRIAL AUTOMATION DISPLAY DEVICE

BACKGROUND

The disclosure relates generally to user interface display devices. More particularly, embodiments of the present disclosure are related to assembling components of a user interface display device associated with an industrial automation system.

An industrial automation system may include one or more user interface display devices to display information relating to monitoring and/or regulating industrial automation equipment in the industrial automation system, or otherwise act as a user interface for the industrial automation system. Generally, a display device may be assembled by coupling various components to one another. These components may include, for example, a bezel, a display, a touch input sensor, a logic board, a power board, and/or a chassis. Each component may be mounted or fixed to another component within the overall display device. Dependent upon how the various components are coupled to one other, stresses may be directed from one component to another component within the assembly. Such stresses may cause components within the display device to flex, deform, or even break. Based on the number of parts in the display device, the process of assembling the display device may be time intensive or costly. Further, as the number of parts in the display device increases, so too does the tolerance stack up for the display device. As such, it may be desirable to minimize the stresses directed to certain components within the display device, as well as the number of parts in the display device to reduce the time and cost of assembly.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a user interface display device for displaying information associated with an industrial automation system may have a display that has a front face and one or more outer edges, a cover lens optically bonded to the front face of the display with an optical-grade adhesive, and a bezel that has a frame. The frame is disposed about the display, and the bezel defines a gap between the frame and the one or more outer edges of the display. The display device may also have a quantity of gap-filling adhesive disposed at one or more locations within the gap between the one or more outer edges of the display and the frame of the bezel. The quantity of gap-filling adhesive may couple the display to the bezel.

In another embodiment, a system may have an industrial automation component and a user interface display device that may mount to the industrial automation component. The display device may have a display that has a front face and one or more outer edges, a cover lens optically bonded to a touch sensor and the front face of the display with an optical-grade adhesive, and a bezel that has a frame. The frame is disposed about the display, and the bezel defines a gap between the frame and the outer edges of the display. The display device may also have a quantity of gap-filling adhesive disposed at one or more locations within the gap between the outer edges of the display and the frame of the bezel. The quantity of gap-filling adhesive may couple the display to the bezel.

In yet another embodiment, a method for assembling a display device associated with an industrial automation system may include optically bonding a cover lens to a front face of a display to form a sub-assembly. The display may have one or more outer edges. The method may also include positioning the sub-assembly within an aperture of a bezel. The bezel may have a frame that is disposed about the display, and the bezel forms a gap between the frame and the outer edges of the display. The method may also include applying a quantity of gap-filling adhesive at one or more locations within the gap between the outer edges of the display and the frame of the bezel to couple the display to the bezel.

DRAWINGS

These and other features, aspects, and advantages of the present disclosure may become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure is directed to an improved user interface display device and improved technique for assembling the user interface display device that may reduce stresses on components within the user interface display device, reduce the cost of assembly of the user interface display device, increase a time efficiency of assembly, and provide other improvements to the assembled display device as described herein. As mentioned above, a user interface display device may be assembled with various components. How the components are coupled to one another may transmit stresses between components. Additionally, based on the number of parts in the display device, the process of assembling the display device may be time intensive or costly. For example, to mount a display assembly to the bezel, traditional techniques may utilize a plastic display carrier to hold the display assembly to the bezel or use one or more standoffs to press the display assembly into the bezel. Such techniques use one or more additional parts to mount the display assembly to the bezel which increases the amount of time and the cost to assemble the display device. Further, designs utilizing these traditional techniques may transmit stresses to adhesives within the display device, causing delamination within the display device.

As such, embodiments of the present disclosure may incorporate designs that reduce stresses within the user interface display device, and reduce the number of parts utilized in mounting the display to the bezel during assembly of the display device, thereby reducing the amount of time and the cost to assemble the display device. For example, the improved display device and the improved technique for assembling the display device may utilize a gap-filling adhesive to mount one or more components of the display device to the bezel of the display device. In some embodiments, the components mounted to the bezel with the gap-filling adhesive may be assembled into a display sub-assembly before being mounted to the bezel. For example, a cover lens, a touch sensor, and a display assembly may be optically bonded with one or more adhesives into the display sub-assembly. The display sub-assembly may then be mounted to the bezel with the gap-filling adhesive. By utilizing the gap-filling adhesive instead of another component, such as the plastic display carrier or the standoffs, embodiments of the present disclosure reduce the stresses directed toward the adhesives used to optically bond components within the display device, and the number of parts used during assembly of the display device, thereby reducing the amount of time and the cost of assembling the display device.

The gap-filling adhesive may be applied in one or more regions between the display and touch sensor sub-assembly and the bezel to minimize pressure applied to the adhesives optically bonding the components of the display sub-assembly to one another. For example, during assembly of the user interface display device, the display sub-assembly may be placed in an installation configuration with respect to the bezel. That is, the display sub-assembly may be positioned within an aperture of the bezel, such that certain components of the display sub-assembly are spaced at a particular distance from a frame of the bezel. The distance between the components of the display sub-assembly and the frame of the bezel may define a space that extends around the display sub-assembly within the bezel. The gap-filling adhesive may be applied to one or more regions in the space between the components of the display sub-assembly and the frame of the bezel such that the gap-filling adhesive may adhere the components of the display sub-assembly to the frame of the bezel at the application regions. As such, the gap-filling adhesive may minimize movement of the display sub-assembly within the bezel, thereby reducing pressure that may be applied to the adhesives optically bonding components of the display sub-assembly to one another. Further, since the gap-filling adhesive is applied within a space between the components of the display sub-assembly and the frame of the bezel within the display device, the gap-filling adhesive may reduce the mechanical component tolerance stack up within the display device.

Figure 1:
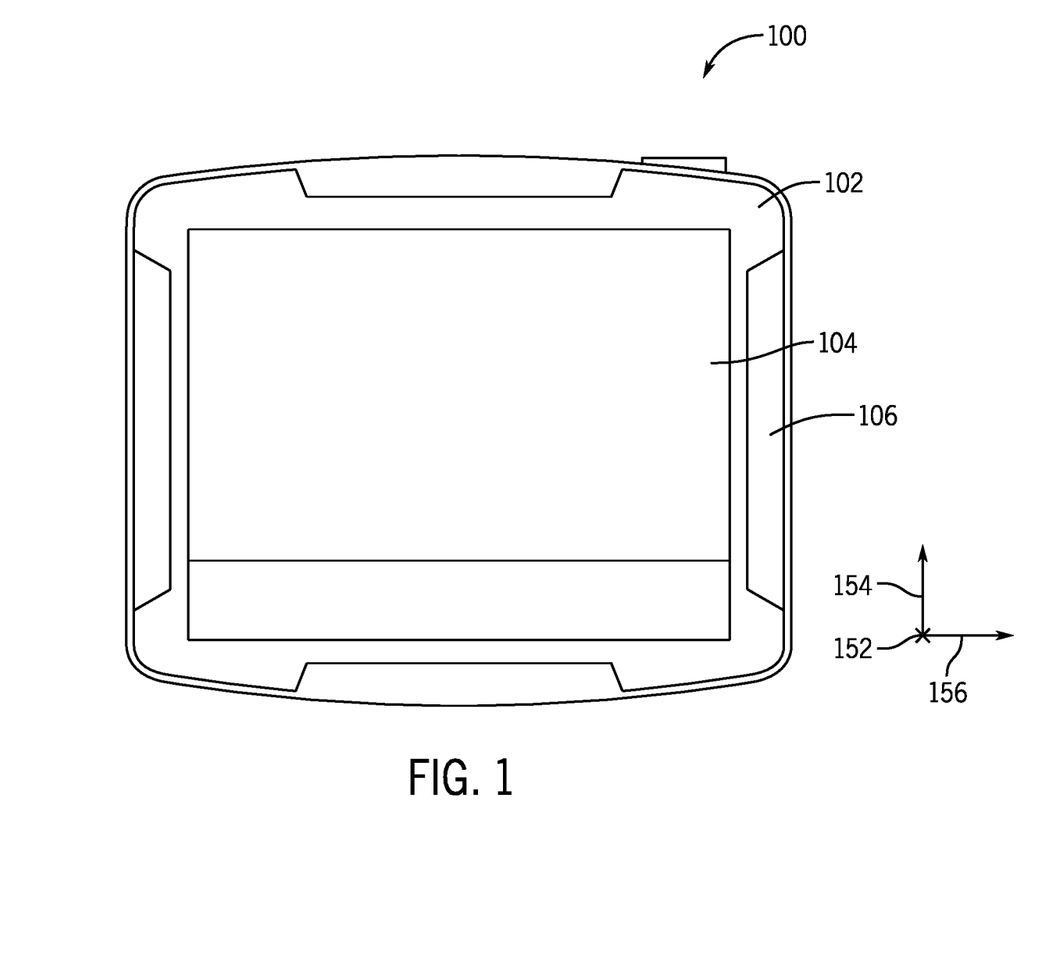
FIG. 1 is a front view of a user interface display device that may be utilized in an industrial automation system, in accordance with an embodiment.

To facilitate discussion of FIGS. 1-4, the user interface display device 100 and its components may be described with reference to a longitudinal axis or direction 152, a vertical axis or direction 154, and a lateral axis or direction 156. With the foregoing in mind, FIG. 1 is a front view of a display device 100 that may be used as a user interface to monitor or regulate industrial automation equipment in an industrial automation system. The user interface display device 100 may be utilized to present information associated with the industrial automation equipment, the industrial system, or the like. In some embodiments, the display device 100 may be a liquid crystal display (LCD), a light-emitting diode (LED) display, a combination LCD-LED display, an organic LED (OLED) display, a quantum dot LED (QLED) display, a plasma display, or the like.

As illustrated in FIG. 1, the user interface display device 100 may include a bezel 102, a display sub-assembly 104, and a housing 106. However, it should be understood that the user interface display device 100 may have any suitable combination of components to facilitate the presentation of information associated with the industrial automation equipment or the industrial system. For example, the display device 100 may have a power board, a logic board, a display adapter board, or the like. In some embodiments, certain components of the user interface display device 100 may not be visible from the front. In some embodiments, the housing 106 of the user interface display device 100 may not be visible from the front.

The bezel 102 may facilitate supporting or securing the display sub-assembly 104 within the user interface display device 100. Generally, the bezel 102 may have a shape and a size that corresponds to the shape and the size of the display sub-assembly. That is, one or more physical dimensions (e.g., length, width, or height) of the bezel 102 may correspond to one or more physical dimensions of the display sub-assembly 104 such that the display sub-assembly 104, or portion thereof, may be held or secured within the bezel 102. Although the bezel 102 and the display sub-assembly 104 illustrated in FIG. 1 are substantially rectangular, it should be understood that the bezel 102 and the display sub-assembly 104 may have any desired shape or size.

In some embodiments, the display sub-assembly 104 may include, for example, a cover lens, a touch sensor, and a display. As described above, the display may be an LCD, a LED display, a combination LCD-LED display, an OLED display, a QLED display, a plasma display, or the like. In some embodiments, the display may have an integrated touch sensor that may detect a physical touch by a user or an operator of the display device 100. The cover lens and the display may be optically bonded together with an optical-grade adhesive. For example, the optical-grade adhesive may include a silicone-based adhesive, an epoxy-based adhesive, a polyurethane-based adhesive, or any other suitable adhesive for minimizing an air gap between the cover lens and the display when bonded together. In some embodiments, the display sub-assembly 104 may include a cover lens, a touch sensor, and a display optically bonded to one another as described above.

The housing 106 of the display device 100 may encompass or support the bezel 102 and the display sub-assembly 104 within the display device 100 after assembly. The housing 106 may also encompass or support other components associated with the display device 100. For example, such components may include a power board, a logic board, a display adapter board, or the like.

Figure 2:
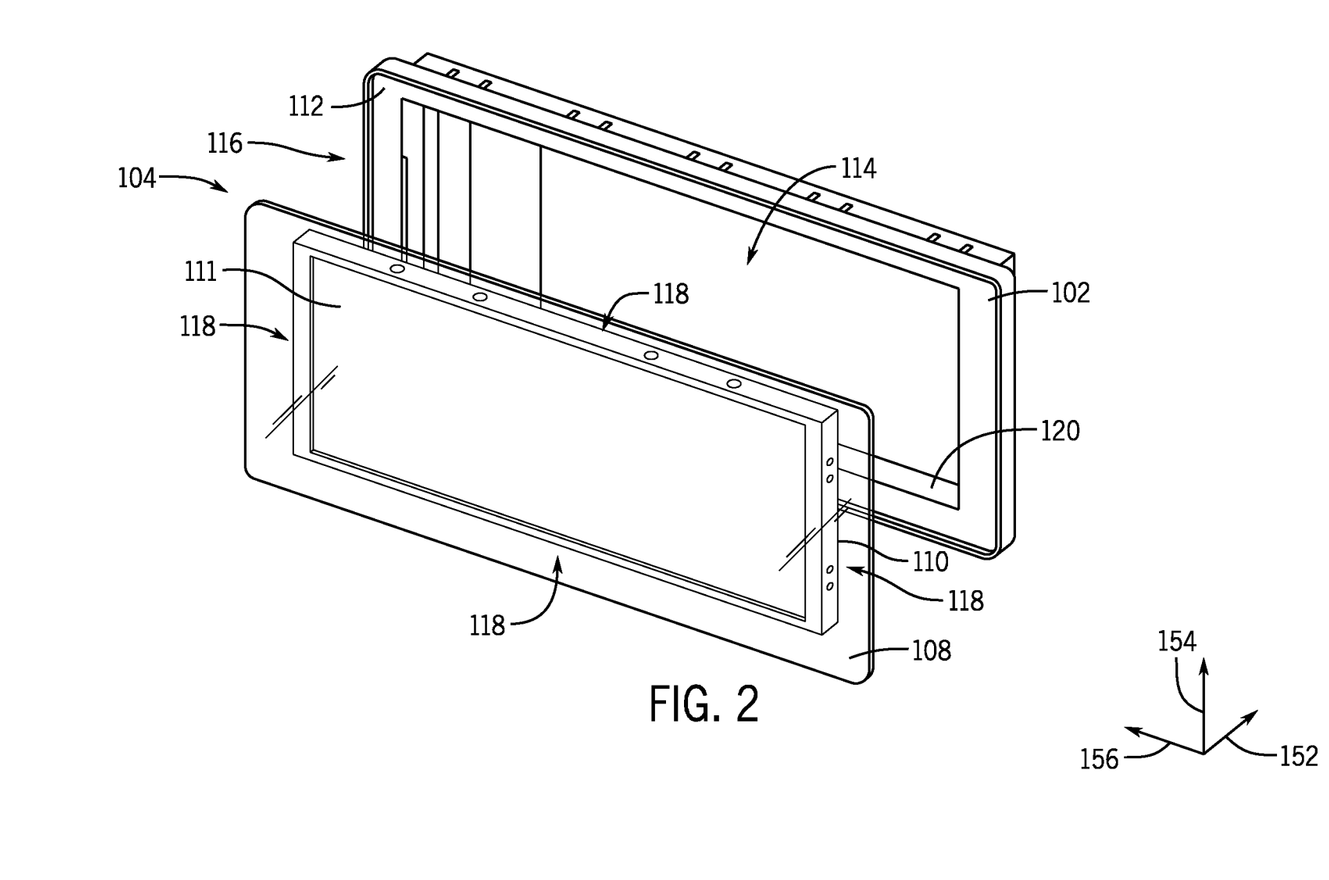
FIG. 2 is a perspective view of a bezel and a display sub-assembly of the user interface display device shown in FIG. 1, in accordance with an embodiment.

As described above, the bezel 102 may facilitate supporting or securing the display sub-assembly 104 within the display device 100. For example, the bezel 102 may restrict movement of the display sub-assembly 104 within the display device 100 in the vertical direction 154, in the lateral direction 156, in the longitudinal direction 152, or a combination thereof. With the foregoing in mind, FIG. 2 illustrates the bezel 102 and the display sub-assembly 104 having a cover lens 108 and a display 110 before being placed in an installation configuration. Additionally, the display 110 may have an integrated touch sensor 111. The bezel 102 may have an aperture 114 in a front-facing portion 112 of the bezel 102 for positioning the display sub-assembly 104 within the bezel 102 in the installation configuration. For example, during assembly of the display device 100, the display sub-assembly 104 may be inserted into the aperture 114 of the bezel 102 from the front 116 of the bezel 102. In the installation configuration, the cover lens 108 may be placed in contact with the front-facing portion 112, or a portion thereof, of the bezel 102. The display 110 may be positioned within the aperture 114 of the bezel 102 in the installation configuration such that the recessed frame 120 may encompass the outer edges 118 of the display 110 but may not be in contact with the outer edges 118 of the display 110. That is, the outer edges 118 of the display 110 may be positioned within the bezel 102 such that the display 110 is spaced at a distance from the recessed frame 120 of the bezel 102.

Figure 3:
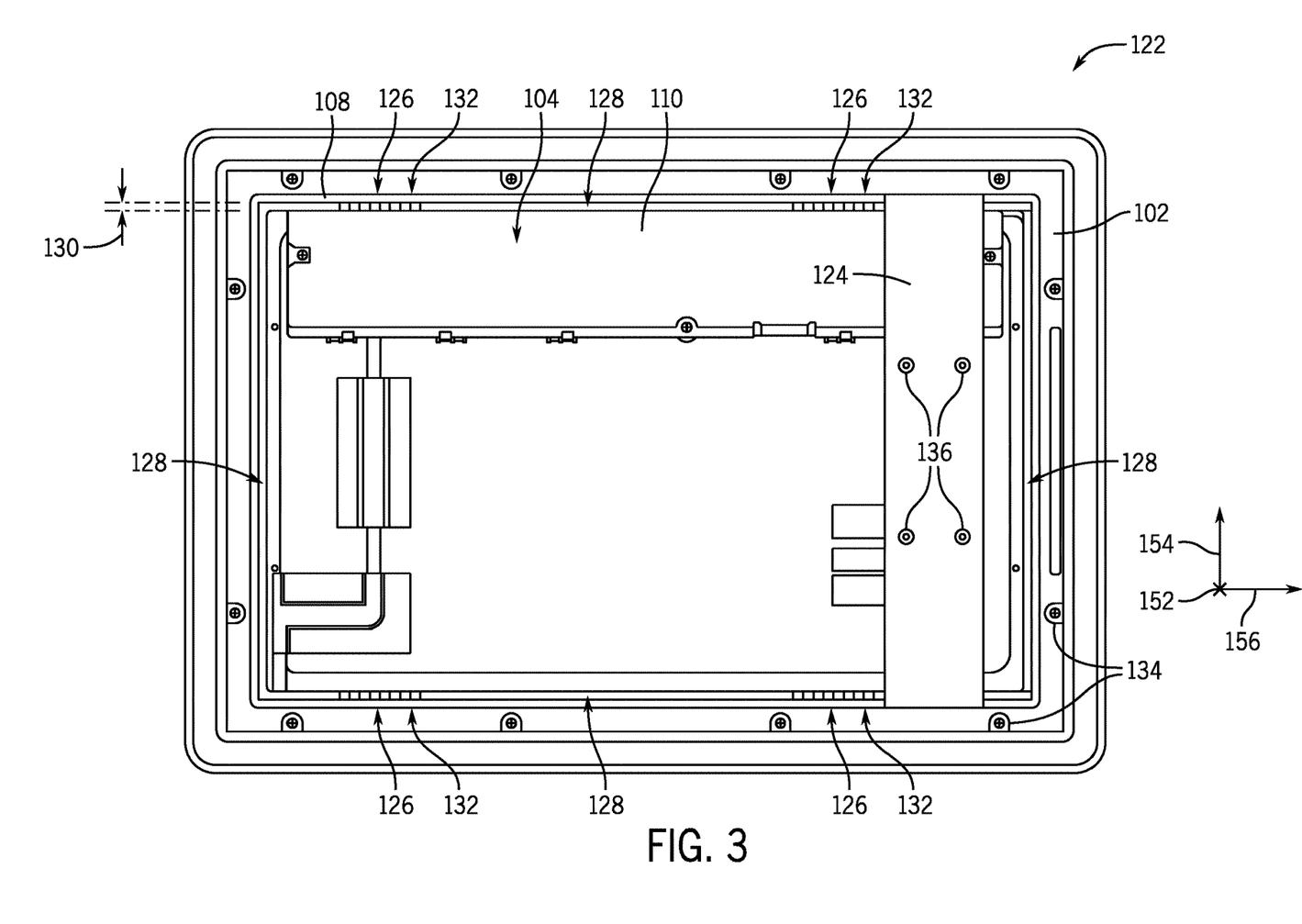
FIG. 3 is a back view of a portion of the user interface display device of FIG. 1 having the display sub-assembly mounted to the bezel with a gap-filling adhesive, in accordance with an embodiment.

As described above, a gap-filling adhesive may be applied to one or more regions in a space defined by the distance between the display 110 and the recessed frame 120 of the bezel 102 to adhere the display sub-assembly 104 to the recessed frame 120 of the bezel 102. FIG. 3 is a back view of a portion 122 of the display device 100 having the bezel 102 mounted to the display sub-assembly 104 within the housing 106. In some embodiments, the display sub-assembly 104 may only be coupled to the bezel 102 via the gap-filling adhesive disposed between the outer edges 118 of the display 110 and the frame 120 of the bezel 102. Accordingly, in some embodiments, the cover lens 108 and the bezel 102 may not be directly coupled to one another (i.e., there may be no adhesive disposed between the cover lens 108 and the bezel 102 or fasteners coupling the cover lens 108 and the bezel 102 to one another), thus reducing stresses acting on the adhesives that optically bond the cover lens 108 to the display 110. Indeed, in the illustrated embodiment, the only component within the display device 100 to which the cover lens 108 is coupled is the display 110. As illustrated in FIG. 3, the display 110 of the display sub-assembly 104 is mounted to the bezel 102 with a gap-filling adhesive 126 at one or more regions 132 within the space 128 between the outer edges 118 of the display 110 and the recessed frame 120. The space 128 may be defined by a distance 130 between the outer edges 118 of the display 110 and the recessed frame 120 of the bezel 102. As described above, the distance 130 may be based on the relative positions of the bezel 102 and the display 110 of the display sub-assembly 104 during assembly of the display device 100 (e.g., after the bezel 102 and the display sub-assembly 104 have been placed in the installation configuration).

As illustrated in FIG. 3, the gap-filling adhesive 126 may be applied to regions 132 within the space 128 between the display 110 and the recessed frame 120 of the bezel 102. The gap-filling adhesive 126 may be a hot melt adhesive (HMA), a room-temperature-vulcanizing (RTV) silicone adhesive, or other suitable adhesive. The gap-filling adhesive 126 may be applied to the regions 132 in the space 128 to adhere the display 110 of the display sub-assembly 104 to the recessed frame 120 of the bezel 102. For example, an HMA applicator may heat the HMA as it is applied to the space 128 between the display 110 and the bezel 102. As the HMA cools and solidifies, the HMA bonds the display 110 to the bezel 102. In another example, as RTV silicone adhesive is applied to the space 128 between the display 110 and the bezel 102, the RTV silicone adhesive begins to cure and become more stable upon being exposed to air. Specifically, as the RTV silicone adhesive is exposed to moisture in the air, the presence of water which causes the RTV silicone adhesive to cure and harden by cross-linking adjacent polymer chains. As a result, the RTV silicone adhesive bonds the display 110 and the bezel 102. Thus, the resulting display device 100 utilizes fewer components as compared to a display device having a plastic display carrier or one or more standoffs to mount the display 110 to the bezel 102. In this way, the display device 100 and technique for assembling the display device 100 may reduce the amount of time and cost to assemble the display device 100.

Additionally, the gap-filling adhesive 126 may be applied to the regions 132 in the space 128 between the display 110 and the recessed frame 120 of the bezel 102 to minimize an amount of pressure applied to the optical-grade adhesive bonding the components of the display sub-assembly 104 together (e.g., the cover lens 108 and the display 110). As illustrated in FIG. 3, the gap-filling adhesive 126 may be applied at four regions 132 in the space 128. For example, a first application region of the gap-filling adhesive 126 may be proximate to a top-left corner of the display 110 and the bezel 102, a second application region of the gap-filling adhesive 126 may be proximate to a top-right corner of the display 110 and the bezel 102, a third application region of the gap-filling adhesive 126 may be proximate to a bottom-right corner of the display 110 and the bezel 102, and a fourth application region of the gap-filling adhesive 126 may be proximate to a bottom-left corner of the display 110 and the bezel 102. Although FIG. 3 illustrates that the gap-filling adhesive 126 may be applied to four regions 132 within the space 128, it should be understood that the gap-filling adhesive 126 may be applied to any suitable number of regions within the space 128 to restrict movement of the display sub-assembly 104 within the display device 100, thereby minimizing the amount of pressure applied to the optical-grade adhesive bonding the components of the display sub-assembly 104 together. In some embodiments, the gap-filling adhesive 126 may be applied throughout the space 128 around the display 110. In other embodiments, the gap-filling adhesive 126 may be applied at one or more discrete regions in the space 128 adjacent to one or more sides (e.g., top, bottom, left, right) of the display 110.

By adhering the display 110 of the display sub-assembly 104 to the recessed frame 120 of the bezel 102, movement of the display sub-assembly 104 may be restricted in the vertical direction 154, in the lateral direction 156, in the longitudinal direction 152, or a combination thereof, in the assembled display device 100. In this way, the mounted configuration of the display sub-assembly 104 and the bezel 102 in the display device 100 may have an increased resistance to movement caused by subsequent handling of the display device 100 by a user or an operator or gravitational forces acting upon the display device 100. As such, the amount of pressure applied to the optical-grade adhesive bonding the components of the display sub-assembly 104 together due to movement of the display sub-assembly 104 within the display device 100 may be minimized. Further, since the gap-filling adhesive 126 is applied within the space 128 between the display 110 of the display sub-assembly 104 and the recessed frame 120 of the bezel 102, the gap-filling adhesive 126 may reduce the amount of mechanical component tolerance stack up associated with the display device 100 as compared to a display device having a plastic display carrier or one or more standoffs to mount the display 110 to the bezel 102.

As illustrated in FIG. 3, the bezel 102 may also be coupled to a touchscreen interface board via a bracket 124 after the display sub-assembly 104 has been adhered to the bezel 102. The bracket 124 may couple the touchscreen interface board via multiple attachment points 136 between the bracket 124 and the display 110. For example, the bracket 124 may be coupled to the touchscreen interface board using one or more fasteners at the attachment points 136, such as screws or bolts. Additionally, the bezel 102 may be coupled to the housing 106 of the display device 100 at multiple attachment points 134 between the bezel 102 and the housing 106. For example, the bezel 102 may be coupled to the housing 106 using one or more fasteners at the attachment points 134, such as screws or bolts.

Figure 4:
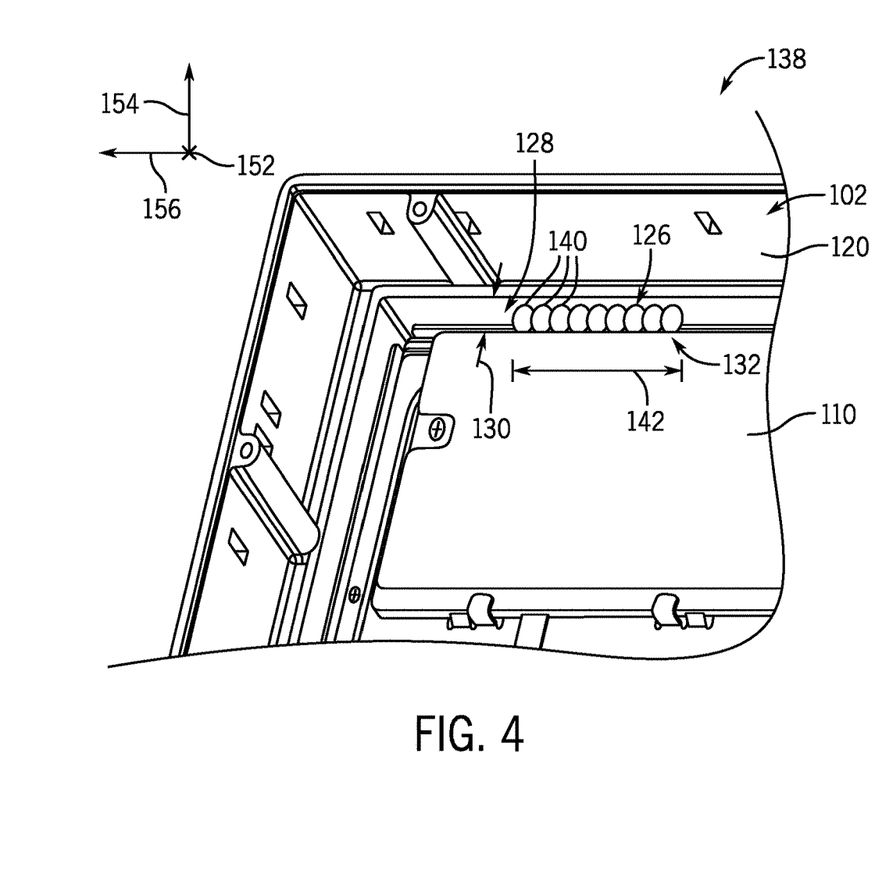
FIG. 4 is a close-up, perspective view of the portion of the user interface display device shown in FIG. 3 having the display sub-assembly mounted to the bezel with a gap-filling adhesive, in accordance with an embodiment.

As described above, the gap-filling adhesive 126 may be applied to regions 132 within the space 128 between the display 110 and the recessed frame 120 of the bezel 102 to mechanically couple the display 110 to the recessed frame 120 of the bezel 102. FIG. 4 is a close-up, back view of a portion 138 of the display device 100 having the bezel 102 mounted to the display 110 of the display sub-assembly 104 with the gap-filling adhesive 126 at a region 132 within the space 128 between the display 110 and the recessed frame 120 of the bezel 102. As described above, the space 128 may be defined by the distance 130 between the display 110 and the recessed frame 120 of the bezel 102. During assembly of the display device 100, the gap-filling adhesive 126 may be applied to the region 132 using any suitable technique. For example, the gap-filling adhesive 126 may be applied using an applicator (e.g., adhesive gun). As such, the amount of time and the cost to assemble the display device 100 may be reduced as compared to the amount of time and the cost to assembly a display device having a plastic display carrier or one or more standoffs to mount the display 110 to the bezel 102.

As illustrated in FIG. 4, the gap-filling adhesive 126 may be applied at the region 132 in multiple spherical applications 140 (e.g., beads). For example, the gap-filling adhesive 126 may be applied at the region 132 in a series of nine spherical applications 140. However, it should be understood that the illustrated embodiment is intended to be exemplary and non-limiting. In some embodiments, the number of individual applications of the gap-filling adhesive 126 at the region 132 may be any other suitable number. For example, the gap-filling adhesive 126 may be applied in a single, continuous application along a length 142 of the application in the lateral direction 156 within the space 128 between the display 110 and the recessed frame 120 of the bezel 102. In another example, the gap-filling adhesive 126 may be applied in two or more discrete applications along the length 142 in the lateral direction 156 within the space 128. Additionally, it should be understood that the spherical application 140 of the gap-filling adhesive 126 is intended to be exemplary and non-limiting. In other embodiments, the geometrical shape of each application of the gap-filling adhesive 126 may be cylindrical, cuboidal, cone-shaped, or any other suitable geometrical shape for adhering the display 110 of the display sub-assembly 104 to the recessed frame 120 of the bezel 102. Each application of the gap-filling adhesive 126 may have a one or more dimensions defined by the space 128 between the display 110 and the recessed frame 120 of the bezel 102. For example, a height of the gap-filling adhesive 126 in the vertical direction 154 may be defined by the distance 130 between the display 110 and the recessed frame 120.

Figure 5:
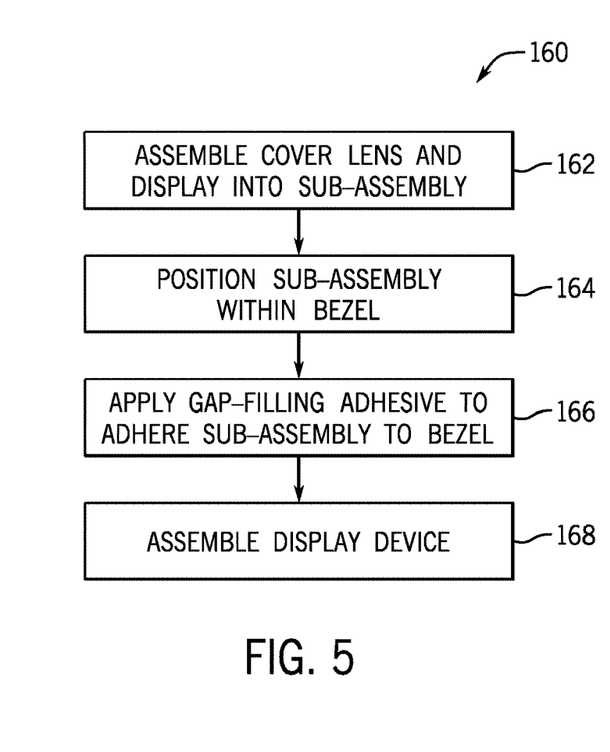
FIG. 5 is a flowchart of a method for mounting the cover lens, touch sensor, and the display to the bezel of FIG. 2 with the gap-filling adhesive, in accordance with an embodiment.

With the foregoing in mind, FIG. 5 illustrates a flowchart of a method 160 for assembling the display device 100. Although the following description of the method 160 is described in a particular order, it should be noted that the method 160 is not limited to the depicted order, and instead, the method 160 may be performed in any suitable order. Referring to FIG. 5, at block 162, the cover lens 108, a touch sensor 111, and the display 110 are assembled into the display sub-assembly 104. For example, the cover lens 108 and the display 110 may be optically bonded together with an optical-grade adhesive. In such embodiments, the display sub-assembly 104 is assembled by optically bonding the cover lens 108 to the display 110 which has the touch sensor 111. In other embodiments, the display sub-assembly 104 is assembled by optically bonding the cover lens 108 to the touch sensor 111, which is optically bonded to the display 110. In any case, the components of the display sub-assembly 104 are optically bonded to one another such that an air gap between the components is minimized after the components are optically bonded to one another. For example, an air gap between the cover lens and the display may be minimized after the cover lens and the display are optically bonded together.

At block 164, the display sub-assembly 104 may be positioned within the aperture 114 in the bezel 102 in the installation configuration of the display sub-assembly 104 and the bezel 102. That is, the cover lens 108 may be placed in contact with the front-facing portion 112, or a portion thereof, of the bezel 102, and the display 110 may be positioned within the bezel 102 such that the recessed frame 120 of the bezel 102 may encompass the outer edges 118 of the display 110 but spaced at a distance 130 from the outer edges of the display 110. At block 166, after the display sub-assembly 104 is positioned within the bezel 102, the gap-filling adhesive 126 may be applied to one or more regions 132 within the space 128 defined by the distance 130 between the display 110 and the recessed frame 120 of the bezel 102. In some embodiments, the gap-filling adhesive 126 may be applied throughout the space 128 around the display 110. In other embodiments, the gap-filling adhesive 126 may be applied at one or more discrete regions 132 in the space 128 adjacent to one or more sides (e.g., top, bottom, left, right) of the display 110.

After the display sub-assembly 104 is mounted to the bezel 102 with the gap-filling adhesive 126, at block 168, the display device 100 may be assembled using the resulting display sub-assembly-bezel structure. For example, the display device 100 may include a power board, a logic board, a display adapter board, or the like. After the display sub-assembly-bezel structure has been assembled, the display device 100 may be assembled with any other suitable components to provide functionality to the display device 100.

Technical effects of the present disclosure include techniques for providing an improved display device and improved technique for assembling the display device that may reduce the amount of time and the cost to assemble the display device as compared to a display device having a plastic display carrier or one or more standoffs to mount a display to a bezel of the display device. For example, the improved display device and the improved technique for assembling the display device utilize a gap-filling adhesive to mount a display sub-assembly of the display device to a bezel of the display device. By utilizing the gap-filling adhesive instead of another component, such as the plastic display carrier or the standoffs, and retaining screws, embodiments of the present disclosure reduce the number of parts used during assembly of the display device, thereby reducing the amount of time and the cost of assembling the display device. Additionally, the gap-filling adhesive may be applied in a space between the display sub-assembly and the bezel to restrict the movement of the display sub-assembly within the bezel, thereby minimizing pressure applied to adhesive optically bonding the components of the display sub-assembly together. Further, since the gap-filling adhesive is applied within the space between the display sub-assembly and the bezel within the display device, the gap-filling adhesive may reduce the amount of mechanical component tolerance (e.g., thickness) associated with the display device.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

What is claimed is:

1. A user interface display device for displaying information associated with an industrial automation system, comprising:
   a display unit comprising a front face and one or more outer edges, wherein the display unit is a liquid crystal display (LCD) unit, a light-emitting diode (LED) display unit, a combination LCD-LED display unit, an organic LED (OLED) display unit, a quantum dot LED (QLED) display unit, or a plasma display unit;
   a cover lens having a rear face, wherein a first portion of the rear face of the cover lens is optically bonded to the front face of the display unit with an optical-grade adhesive, forming a display subassembly;
   a bezel comprising a frame, wherein the frame is disposed about the display unit wherein the bezel defines a gap between the frame and the one or more outer edges of the display unit, and wherein a front-facing portion of the frame is in direct contact with a second portion of the rear face of the cover lens; and
   a quantity of gap-filling adhesive disposed at one or more locations within the gap between the one or more outer edges of the display unit and the frame of the bezel, wherein only the quantity of gap-filling adhesive between the one or more outer edges of the display unit and the frame of the bezel is configured to adhere the display subassembly to the bezel.

2. The user interface display device of claim 1, wherein the cover lens is only coupled to the display within the display device.

3. The user interface display device of claim 1, wherein the quantity of gap-filling adhesive comprises a first amount of hot melt adhesive or a second amount of room-temperature-vulcanizing silicone adhesive.

4. The user interface display device of claim 1, wherein the quantity of gap-filling adhesive is disposed in a spherically shaped application region at each of the one or more locations.

5. The user interface display device of claim 1, wherein the quantity of gap-filling adhesive is applied to the gap in a single, continuous application of the quantity of gap-filling adhesive along a length of the gap.

6. The user interface display device of claim 1, wherein the quantity of gap-filling adhesive is disposed at the one or more locations within the gap at a first region at a top of the display unit and at a second region at a bottom of the display unit.

7. The user interface display device of claim 1, wherein the quantity of gap-filling adhesive is disposed at the one or more locations within the gap at a first region and a second region at a top of the display unit and at a third region and a fourth region at a bottom of the display unit, wherein the first region and the third region are proximate to a left side of the display unit and the second region and the fourth region are proximate to a right side of the display unit.

8. A system, comprising:
   an industrial automation component; and
   a user interface display device configured to couple to the industrial automation component, the display device comprising:
      a display unit comprising a front face and one or more outer edges, wherein the display unit is a liquid crystal display (LCD) unit, a light-emitting diode (LED) display unit, a combination LCD-LED display unit, an organic LED (OLED) display unit, a quantum dot LED (QLED) display unit, or a plasma display unit;
      a cover lens having a rear face, wherein a first portion of the rear face of the cover lens is optically bonded to a touch sensor and the front face of the display unit with an optical-grade adhesive, forming a display subassembly;
      a bezel comprising a frame, wherein the frame is disposed about the display unit, and wherein the bezel defines a gap between the frame and the one or more outer edges of the display unit, and wherein a front-facing portion of the frame is in direct contact with a second portion of the rear face of the cover lens; and a quantity of gap-filling adhesive disposed at one or more locations within the gap between the one or more outer edges of the display unit and the frame of the bezel, wherein only the quantity of gap-filling adhesive between the one or more outer edges of the display unit and the frame of the bezel is configured to adhere the display subassembly to the bezel.

9. The system of claim 8, wherein the display unit comprises the touch sensor.

10. The system of claim 8, wherein the quantity of gap-filling adhesive comprises a first amount of hot melt adhesive or a second amount of room-temperature-vulcanizing silicone adhesive.

11. The system of claim 8, wherein the bezel is coupled to a housing of the user interface display device and the display subassembly is adhered to the bezel within the housing of the user interface display device.

12. The system of claim 8, wherein the user interface display device comprises a power board, a logic board, a display adapter board, or a combination thereof.

13. The system of claim 8, wherein the optical-grade adhesive comprises a silicone-based adhesive, an epoxy-based adhesive, or a polyurethane-based adhesive.

\* \* \* \* \*